United States Patent
Moulin

[19]

[11] Patent Number: 6,137,631
[45] Date of Patent: Oct. 24, 2000

[54] ILLUMINATION SYSTEM AND METHOD FOR SPATIAL MODULATORS

[75] Inventor: Michel Moulin, Apples, Switzerland

[73] Assignee: Kodak Polychrome Graphics LLC, Norwalk, Conn.

[21] Appl. No.: 09/290,828

[22] Filed: Apr. 13, 1999

[30] Foreign Application Priority Data

Mar. 12, 1999 [EP] European Pat. Off. .............. 99104943

[51] Int. Cl.[7] .................................................. G02B 27/10
[52] U.S. Cl. ............................................................ 359/618
[58] Field of Search ........................... 359/618; 362/268, 362/35

[56] References Cited

U.S. PATENT DOCUMENTS

| | | | |
|---|---|---|---|
| 4,281,904 | 8/1981 | Sprague et al. | 359/263 |
| 4,316,196 | 2/1982 | Jacobs | 346/1.1 |
| 4,370,026 | 1/1983 | Dubroeucq et al. | 359/578 |
| 4,746,942 | 5/1988 | Moulin | 396/549 |
| 4,787,013 | 11/1988 | Sugino et al. | 362/32 |
| 5,517,359 | 5/1996 | Gelbart | 359/623 |
| 5,825,552 | 10/1998 | Kurtz et al. | 359/629 |
| 5,923,475 | 7/1999 | Kurtz et al. | 359/619 |

FOREIGN PATENT DOCUMENTS

| | | |
|---|---|---|
| 342292 | 11/1989 | European Pat. Off. . |
| 19751106 | 5/1998 | Germany . |

*Primary Examiner*—Ricky Mack
*Attorney, Agent, or Firm*—Baker Botts L.L.P.

[57] ABSTRACT

The present invention is directed to a system and a method for illuminating imaging radiant energy from a laser source onto a spatial modulator. It comprises means or a step of focusing the radiant energy from the laser source at a focal point. There is further provided a mixing means mixing the radiant energy substantially at or downstream the focal point, the mixing means having an input, a plurality of reflecting surfaces and an output, wherein the reflecting surfaces are arranged so that upon entry of the radiant energy into the input of the mixing means the radiant energy is subjected to multiple reflections and at the output the distribution of the radiant energy is substantially uniform.

29 Claims, 5 Drawing Sheets

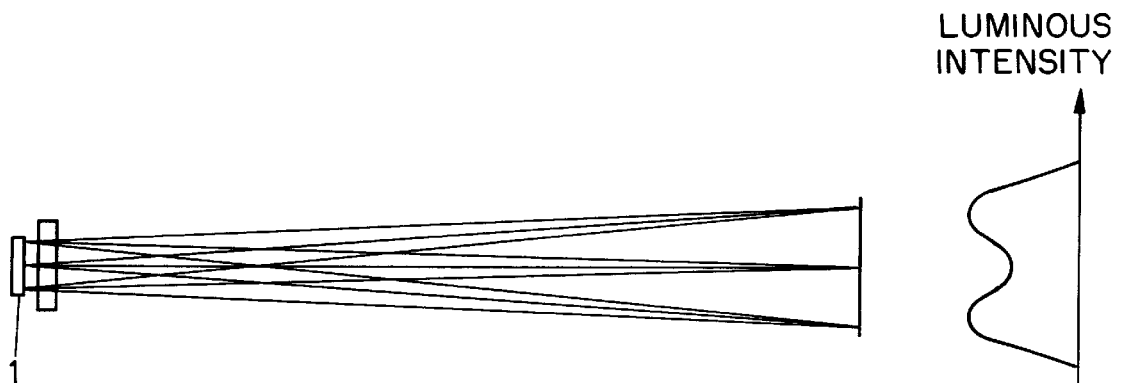
FIG. 1
FIG. 2
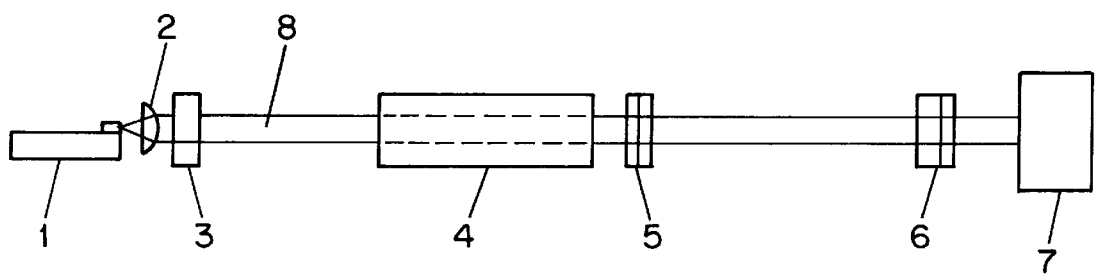
FIG. 3
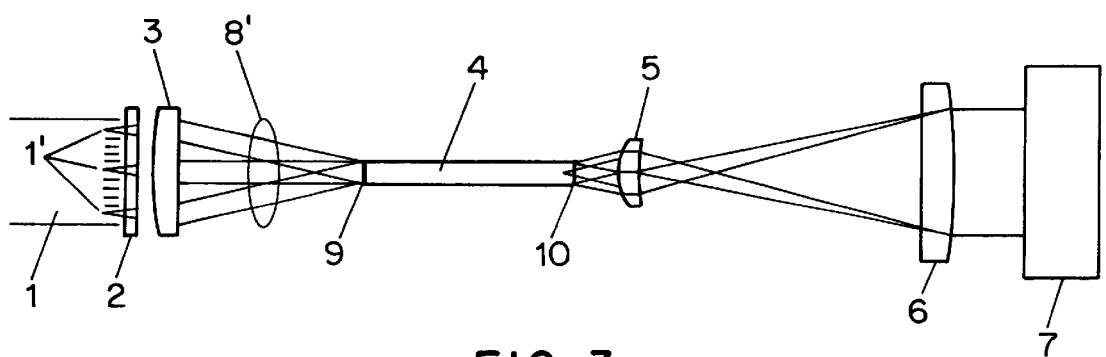
FIG. 3a $\alpha_b$ = DIVERGENCE ANGLE OF BEAMS GENERATED BY AN EMITTER LOCATED AT THE EDGE OF THE DIODE.

$\alpha_c$ = DIVERGENCE OF AN EMITTER LOCATED AT THE CENTER OF THE DIODE.

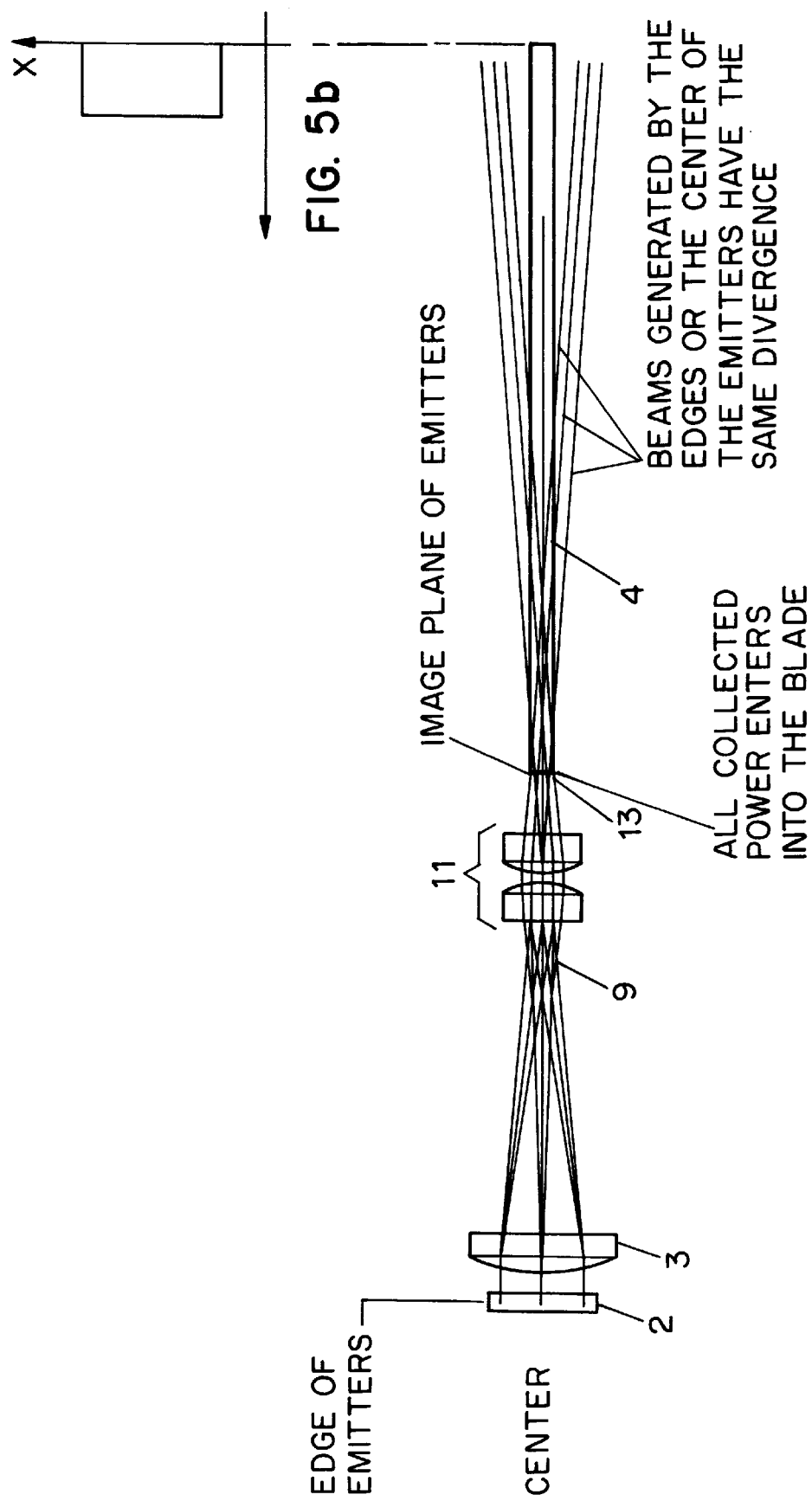

ILLUMINATION SYSTEM AND METHOD FOR SPATIAL MODULATORS

FIELD OF THE INVENTION

The present invention is directed to a system and a method particularly for illuminating spatial modulators. In particular, it concerns an optical system for directing radiant energy produced by a laser source, such as a high power laser array, to a spatial modulator for imaging heat or light sensitive media.

BACKGROUND OF INVENTION

It concerns more particularly systems in which a spatial modulator is used in connection with a laser source to produce a column of individually controllable spots as described in U.S. Pat. No. 4,746,942. This column of spots is moved transversally to the motion of the media to produce successive adjacent bands as shown in FIG. 3 of said patent. In order to avoid any noticeable discontinuity between successive bands it is not only necessary that the relative displacement of the bands and the media corresponds exactly to the height of a column of spots but also that all the spots be substantially identical in form and in intensity.

In the axis corresponding to the height of the column of optical gates, the illumination of the modulator should preferably be uniform and the impinging light beam must show very little divergence so that substantially all the light crossing the modulator enters the pupil of the projection optics. The other axis, width axis, demands a highly collimated beam to produce a column of spots measuring 10 microns or less in width. This necessitates the use of a laser source having a resolution of the order of one micron in this width axis.

To expose highly sensitive media such as silver halides surfaces, electrophotographic plates or films, it is possible to use low-power laser diodes. In this case, the gaussian intensity profile can be transformed by optical means as described in U.S. Pat. No. 4,746,942.

Temperature sensitive polymers (offset plates or any heat sensitive media) demand exposure to stronger luminous power. This can be obtained by the use of high power laser diode(s) to illuminate the spatial modulator. The emission profile location of the diode in the direction of the height (also named "fast axis") is of the order of a micron and has a gaussian emission profile. This must match the width of the column of spots.

In the other direction, particularly high power diodes are available with different types of emitters and configurations. With one-emitter diodes the width of the emitted beams can measure from one to several hundred microns. The most powerful diodes have a multiplicity of emitters located along a one-centimeter bar. They can be located serially or in regularly spaced groups. The angular divergence in this axis is small but the angular emission profiles are irregular and vary from a diode to another. Thus, the distribution of the radiant energy is not uniform.

U.S. Pat. No. 5,517,359 is directed to a complex apparatus for coupling a broad emitting area laser diode made of multiple emitters operating in parallel to a linear light valve. The apparatus images each one of the emitters onto the linear light valve, superimposing them in order to increase the immunity to defects occurring in any individual emitter.

SUMMARY OF THE INVENTION

It is the object of the present invention to provide an improved system and an improved method for illuminating a spatial modulator.

This object is achieved with an illumination system and an illumination method according to the respective claims.

The means utilized with low power laser diodes are not applicable with high power lasers because their distribution profiles are not defined. It could be assumed that with laser diodes having a plurality of emitters the superposition of the luminous energy of different diodes (as can be obtained by a simple lens in front of the diode as shown in FIG. 1), could produce substantial uniform light distribution. However, for a given diode, emitters basically have the same characteristics and their superposition shows the same profile as an individual emitter and is consequently non-uniform. In addition, an important part of the energy is lost on the edges.

This invention makes it possible to produce a substantially uniform energy distribution with a well defined width, a very small loss and an optimal collimation.

The invention has the advantage that it provides a system and a method for obtaining a substantially uniform light distribution on the total height of at least one modulator associated with any type of power laser diode. The system preferably includes various lenses associated with an optical mixer preferably in the form of a glass blade to equalize by multiple internal reflections the light energy of the laser emitters. The glass blade is preferably made of boronsilicate-glass and has in a particularly preferred embodiment a width of approximately 2.5 mm and a length of approximately 75 mm.

A preferred laser source emits the radiant energy in the infrared spectrum with a wavelength of approximately 800 nm to approximately 850 nm, preferably with a wavelength of approximately 808 nm. The preferred laser source is further a high power diode having a plurality of emitters arranged in a linear array.

A preferred focusing means comprises a collimator with a cylindrical lens for collimating the radiant energy in the vertical dimension and an array of cylindrical lenses substantially aligned with each emitter of the high power diode for collimating the radiant energy in the horizontal dimension. The cylindrical lens for collimating the radiant energy in the vertical dimension is preferably an asperic lens. Alternatively, an array of lenses could be used for collimating the radiant energy in both horizontal and vertical dimensions.

In a furthermore preferred embodiment there is provided a pair of additional cylindrical lenses between the focal point and the input of the mixing means to form an image of the radiant energy source at the input of the mixing means and to obtain substantially the same divergence for the radiant energy being emitted from the laser source.

Other objects, features and advantages of the invention will be apparent from the following detailed description and drawings which show by way of illustration, and not limitation, preferred embodiments of the invention.

BRIEF DESCRIPTION OF THE DRAWINGS

In the drawings preferred embodiments of the present invention are exemplified. Same reference numerals in the figures represent identical or similar components.

FIG. 1 represents a laser having a plurality of emitters.

FIG. 2 represents the energy distribution from the laser of FIG. 1.

FIG. 3 is a schematic representation of the new illumination system in a first plane parallel to the vertical axis of the system.

FIG. 3a represents the same system in a second plane parallel to the horizontal axis of the system.

FIG. 5a shows the light rays entering a mixing means in the improved system with the path the rays would follow if not subjected to multiple reflection inside the mixing means.

FIG. 5b represents schematically the power distribution at the output of the mixing means.

DESCRIPTION OF THE PREFERRED EMBODIMENTS

Figure 4:
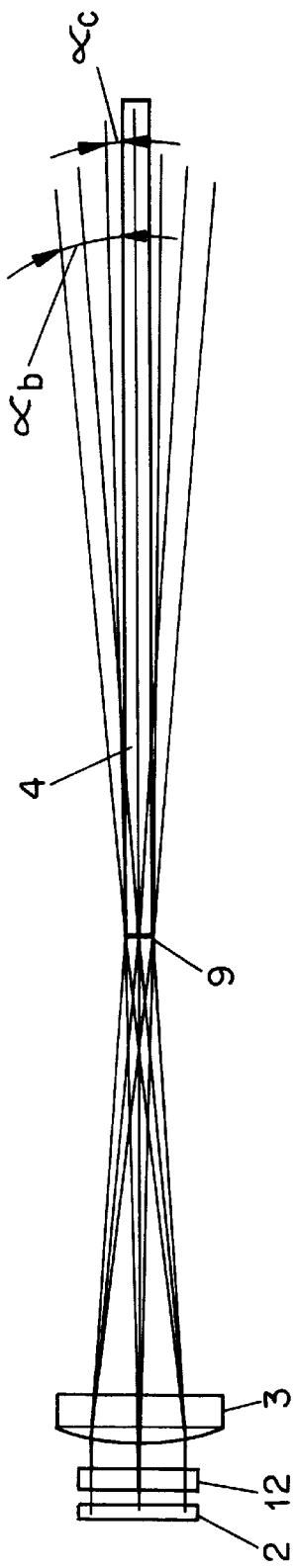
FIG. 4 represents a portion of the path of the light rays through the optical system, with the path the rays would follow if not subjected to multiple reflection inside the mixing means.

FIG. 1 shows a laser 1 with several emitters, and FIG. 2 the respective energy distribution of the laser in the direction of the height.

FIGS. 3 and 3a represent the illumination system as per the present invention in the case of a laser diode 1 with several scattered emitters (reference numeral 1' in FIG. 3a). The fast axis shown in FIG. 3 is collimated by a cylindrical lens 2 which is preferably aspherical. Typical fast axis rays after collimation by lens 2 are represented by rays (8). Such a laser diode 1 and the cylindrical lens 2 are available, e.g. from the company Jenoptik Laseroptik GmbH in Germany, having the brand name JOLD-32.

Figure 6:
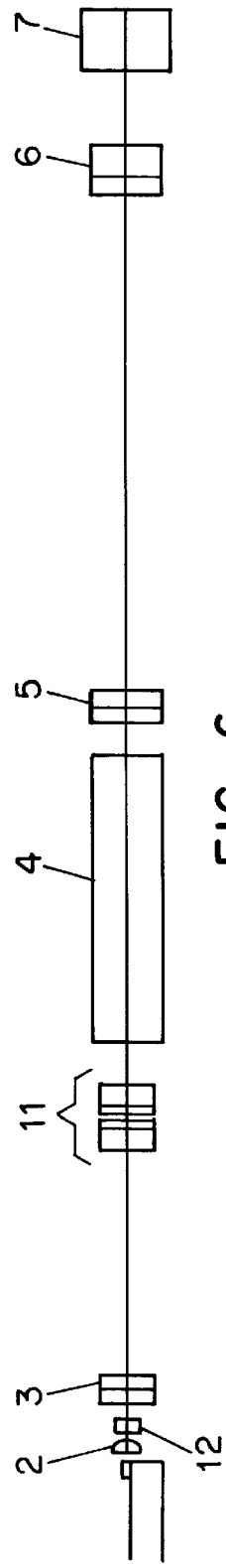
FIG. 6 represents along the fast axis, the path of light rays emerging from a power laser diode with multiple lenslets.
Figure 6A:
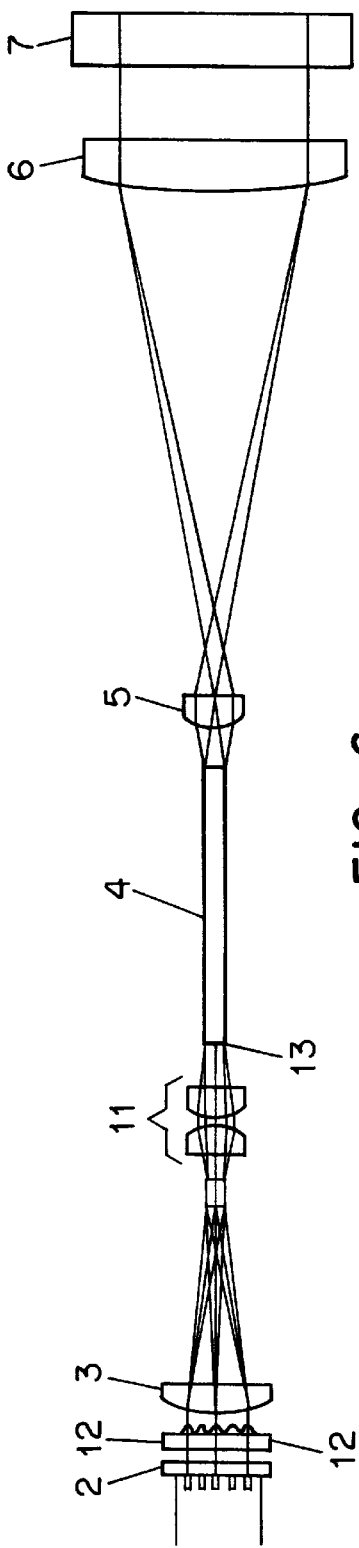
FIG. 6a represents along the slow axis the same arrangement as in FIG. 6.

For diodes having spaced groups of emitters or large section emitters, such as for example groups or emitters 150 microns wide, spaced by 500 microns, an array of cylindrical microlenses 12 (FIG. 4) spaced according to the emitter spacing, can be located between lenses 2 and 3 of FIG. 6. This array permits the reduction of the divergence of the bundle at the entry to the modulator. Such an array of lenses 12 is available, e.g., from the company Limo, Germany.

In the other axis (as shown in FIG. 3a) the cylindrical lens 3 is located after the collimation lens 2. The light rays emerging from each emitter 1' merge at the focal point 9 of the lens. Typical slow axis rays after collimation by lens 2 are represented by rays (8').

The bundle of rays produced by the different emitters enters into a mixing means 4 the width of which is substantially equal to the width of the ray bundle at this point 9. The mixing means 4 is most preferably a glass blade 4, which is preferably made of boronsilicate-glass. Upon entry of the light rays into the input or input end of the glass blade 4 they are subjected to multiple reflections inside the glass blade 4 so that the distribution of the radiant energy is uniform. In the shown embodiment the different luminous intensities are mixed at the output or exit end of glass blade 4. The image of this output is formed on modulator 7 by cylindrical lenses 5 and 6. Lens 6 is more specifically used to collimate the light bundle impinging the modulator 7. It will be clear to the person skilled in the art that the glass blade 4 can be replaced by mirrors or can have other appropriate forms which may be standard forms.

Figure 4C:
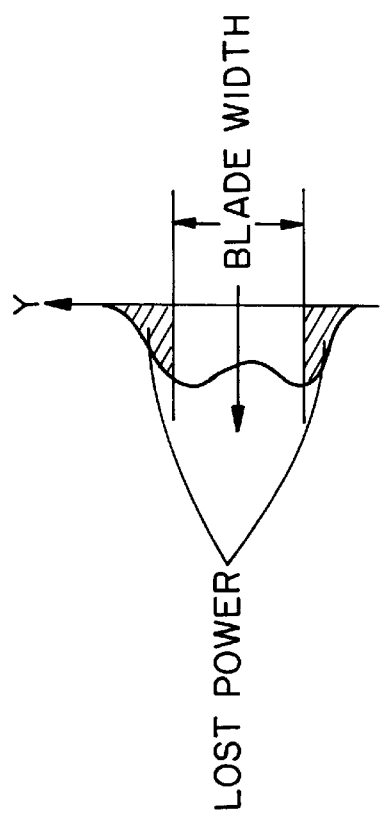
FIGS. 4b and 4c represent the light distribution curve at the entrance of the blade.
Figure 4A:
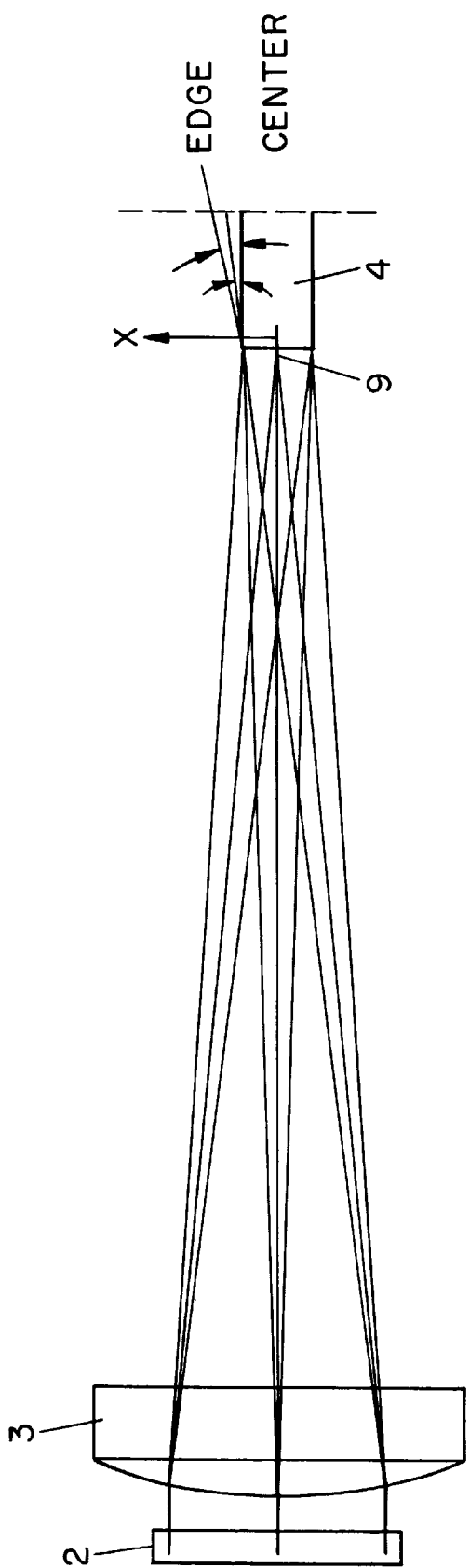
FIG. 4a represents the path of the light rays to the entrance of the blade.
Figure 4B:
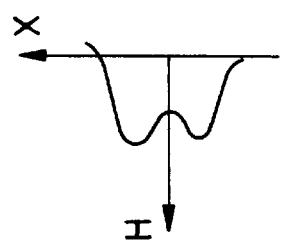

FIG. 4a represents the path of the light rays to the entrance of the mixing means and FIGS. 4b and 4c the light distribution at the entrance.

Figure 5:
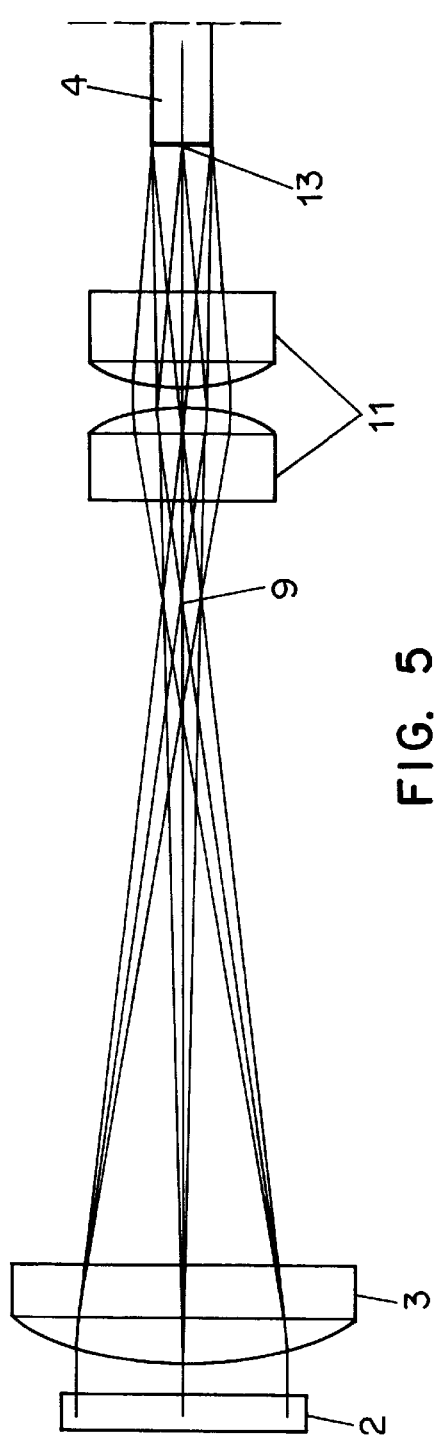
FIG. 5 illustrates a further improved system of FIG. 3 in a plane parallel to the horizontal axis of the system.

In FIG. 3 where the general configuration is shown, the width of the bundle at point 9 is not exactly defined and the divergence of rays emerging from the edges of the diode 1 is more important that those from the center (see angles (b and (c in FIG. 4). Because the divergence of the bundle at the output of the blade corresponds to the maximum divergence at its input with a blade 4 having parallel sides, this arrangement does not necessarily lead to the optimum collimation of the rays on the modulator as well as maximum power efficiency. This arrangement can be further improved as shown in FIGS. 5, 5a, 6 and 6a where a pair of additional cylindrical lenses 11 is located between the focal point 9 of lens 3 and the input 13 of blade 4. This pair of lenses is designed and located to form an image of the emitters at the input 13 of the glass blade 4 and also to obtain the same divergence for the rays emerging from the edges of the diode as from those emerging from its center. In this arrangement the width of the glass blade 4 corresponds to the width of the image of the emitters and all the power of the diode collected by lenses 2 and 3 entering the glass blade 4 emerges at its end and on its image at the modulator. The divergence of the bundle at the output is minimized thus allowing as good collimation as possible and the luminous power is substantially uniformly spread on the width of the image at the output of the blade as shown in FIG. 5b. Lenses 3, 5, 6 and 11 are commercially available, e.g. from the company Opto Sigma, USA.

The modulator 7 can be electro-optical, acousto-optical or electromechanical (deformable mirrors). A preferred modulator is a TIR-modulator, as for example described in U.S. Pat. No. 4,281,904. As also described in this reference with respect to its FIGS. 6(a) to 6(e), it is possible to introduce various phase microscopy configurations for converting the phase modulated by the TIR-modulator into corresponding light intensity variations. In particular, an embodiment is preferred for the present invention with a multiple point laser source which makes use of a dark field illumination, as is for example described in the above-mentioned reference with respect to its FIG. 6(e).

I claim:

1. Illumination system for directing radiant energy from a laser source comprising means for focusing the radiant energy from the laser source at a focal point and means for mixing the radiant energy substantially at or downstream from the focal point, the mixing means having an input, a plurality of reflecting surfaces and an output, wherein the reflecting surfaces are arranged so that upon entry of the radiant energy into the input of the mixing means the radiant energy is subjected to multiple reflections and at the output the distribution of the radiant energy is substantially uniform and the output of the mixing means is imaged onto a modulator.

2. Illumination system according to claim 1, wherein said reflecting surfaces of the mixing means are substantially parallel.

3. Illumination system according to claim 1, wherein said reflecting surfaces of the mixing means are mirrors.

4. Illumination system according to claim 1, wherein said mixing means is made of glass.

5. Illumination system according to claim 4, wherein said mixing means is made of boronsilicate-glass.

6. Illumination system according to claim 1, wherein said mixing means has a parallelepoidal shape, the side surfaces of the parallelepoidal mixing means constituting the reflecting surfaces and a first face of the mixing means being directed to the focusing means constituting the input and an opposite second face constituting the output of the mixing means.

7. Illumination system according to claim 1, wherein said mixing means has a width which substantially corresponds to the width of the radiant energy at the input of the mixing means.

8. Illumination system according to claim 1, wherein said mixing means has a width of approximately 2.5 mm and a length of approximately 75 mm.

9. Illumination system according to claim 1, wherein said laser source emits the radiant energy in the infrared spectrum with a wavelength of approximately 800 nm to approximately 850 nm.

10. Illumination system according to claim 1, wherein said laser source comprises at least one large section laser emitter.

11. Illumination system according to claim 1, wherein said laser source is a high power diode having a plurality of emitters arranged in a linear array.

12. Illuminating system according to claim 11, wherein adjacent emitters being spaced by approximately 500 microns.

13. Illumination system according to claim 11, wherein said focusing means comprises a collimator with a cylindrical lens for collimating the radiant energy in the vertical dimension and an array of cylindrical lenses substantially aligned with each emitter of the high power diode for collimating the radiant energy in the horizontal dimension.

14. Illumination system according to claim 13, wherein said cylindrical lens for collimating the radiant energy in the vertical dimension is an asperic lens.

15. Illumination system according to claim 11, wherein each emitter is approximately 150 microns wide.

16. Illumination system according to claim 1, wherein there is further provided a pair of additional cylindrical lenses between the focal point and the input of the mixing means to form an image of the radiant energy at the input of the mixing means and to obtain substantially a uniform divergence for the radiant energy being emitted from the laser source.

17. Illumination system according to claim 1, wherein the laser source emits the radiant energy in the infrared spectrum with a wavelength of approximately 808 nm.

18. An illumination method comprising (i) focusing the radiant energy from a laser source at a focal point, (ii) providing mixing means, (iii) mixing the radiant energy substantially at or downstream from the focal point, the mixing means having an input, a plurality of reflecting surfaces and an output, wherein the reflecting surfaces are arranged so that upon entry of the radiant energy into the input of the mixing means the radiant energy is subjected to multiple reflections and at the output the distribution of the radiant energy is substantially uniform, and (iv) imaging onto a modulator the exiting radiant energy of the mixing means.

19. Device comprising (i) an illumination system for imaging radiant energy from a laser source onto a spatial modulator, comprising means for focusing the radiant energy from the laser source at a focal point and means for mixing the radiant energy substantially at or downstream from the focal point, the mixing means having an input, a plurality of reflecting surfaces and an output, wherein the reflecting surfaces are arranged so that upon entry of the radiant energy into the input of the mixing means the radiant energy is subjected to multiple reflections and at the output the distribution of the radiant energy is substantially uniform, and (ii) an electro-optical, acousto-optical or electro-mechanical modulator illuminated by the illumination system.

20. Device according to claim 19, wherein the device is adapted to image radiant energy onto heat sensitive offset printing plates.

21. An illumination system comprising:
(a) a laser surface having a plurality of emitters of radiant energy lying on a common plane;
(b) a modulator having a column of optical gates, wherein the laser source emitters are positioned in a plane parallel with the column of optical gates;
(c) a first lens forming and projecting low-divergence beams from the laser source emitters in a plane perpendicular to the plane of optical gates;
(d) a second lens projecting and focalizing beams located on the plane of optical gates;
(e) a mixing unit comprising two reflecting surfaces perpendicular to the plane of the light emitters, and having lengths sufficient to cause multiple reflections, wherein the mixing unit has an entrance and an exit end, the entrance end receiving the energy from the laser emitters, and the surfaces at the entrance end are spaced apart by an amount greater than the width of the beams entering the mixing unit; and
(f) a telecentric objective comprising a plurality of cylindrical lenses which receives the exiting rays from the mixer unit and makes an enlarged image of the output end of the mixer unit.

22. An illumination system comprising:
(a) a laser surface having a plurality of emitters of radiant energy lying on a common plane;
(b) a modulator having a column of optical gates, wherein the laser source emitters are positioned in a plane parallel with the column of optical gates;
(c) a first lens forming and projecting low-divergence beams from the laser source in a plane perpendicular to the plane of optical gates;
(d) a second lens to project and focalize beams located on the plane of optical gates;
(e) a mixing unit comprising two reflecting surfaces perpendicular to the horizontal plane of the light source, and having lengths sufficient to cause multiple reflections, wherein the mixing unit has an entrance and an exit end, the entrance end receiving the energy from the laser source, and the surfaces at the entrance end are spaced apart by an amount greater than the width of the beams entering the mixing unit;
(f) a plurality of aspheric cylindrical lenses located between the focal point of the lens which is used to project and focalize beams located on the plane of optical gates and the entrance end of the mixing unit wherein the plurality of lenses form an image of the laser emitters at the entrance in the plane of the optical gates; and
(g) a telecentric objective comprising a plurality of cylindrical lenses which receives the exiting rays from the mixer unit and makes an enlarged image on a modulator of the output end of the mixer unit.

23. The illumination system of claim 21, wherein the laser source is a diode laser bar having a plurality of emitters.

24. The illumination system of claim 22, wherein the first lens and the plurality of aspheric cylindrical lenses constitute a telecentric objective reducing the image of the laser source in the emitters plane by a factor of five.

25. The illumination system of claim 21, wherein the mixing means surfaces have a spacing of about 2.2 mm and a length of about 175 mm.

26. The illumination system of claim 21, wherein the spacing of the mixing unit reflecting surfaces is substantially the same at the entrance and exit ends.

27. The illumination system of claim 21, wherein the telecentric objective enlarges the image of the mixing unit exit end by a factor of about 15.

28. The illumination system of claim 21, wherein the mixing unit is a glass blade.

29. The illumination system of claim 21, wherein the low divergence rays exiting the second lens can be re-focalized under diffraction-limited conditions.

* * * * *

UNITED STATES PATENT AND TRADEMARK OFFICE
CERTIFICATE OF CORRECTION

PATENT NO. : 6,137,631
DATED : October 24, 2000
INVENTOR(S) : Moulin

Page 1 of 1

It is certified that error appears in the above-identified patent and that said Letters Patent is hereby corrected as shown below:

Column 5,
Line 19, "asperic" should read -- aspheric --

Column 2,
Line 37, "asperic" should read -- aspheric --

Signed and Sealed this

Eleventh Day of December, 2001

Attest:

NICHOLAS P. GODICI
Attesting Officer  Acting Director of the United States Patent and Trademark Office